United States Patent [19]

Weber et al.

[11] Patent Number: 5,308,565

[45] Date of Patent: May 3, 1994

[54] METHOD OF PREPARING MODIFIED POLYPHENYLENE OXIDE RESIN SYSTEMS FOR ELECTRICAL LAMINATES HAVING IMPROVED SOLDERABILITY AND SOLVENT RESISTANCE

[75] Inventors: Christian K. Weber, Elgin, Ill.; Michael G. Minnick, Fort Wayne, Ind.

[73] Assignee: General Electric Company, Worthington, Ohio

[21] Appl. No.: 14,028

[22] Filed: Feb. 5, 1993

[51] Int. Cl.$^5$ .............................................. B29C 67/12
[52] U.S. Cl. .................................... 264/112; 162/101; 264/115; 264/122; 264/257; 264/258
[58] Field of Search ............... 264/112, 115, 122, 257, 264/258; 162/101

[56] References Cited

U.S. PATENT DOCUMENTS

| | | | |
|---|---|---|---|
| 3,422,062 | 1/1969 | Segal et al. | |
| 3,716,449 | 2/1973 | Gatward et al. | 162/101 |
| 4,853,423 | 8/1989 | Walles et al. | 523/428 |
| 5,073,438 | 12/1991 | Meier et al. | 264/258 |
| 5,089,343 | 2/1992 | Colborn et al. | 428/416 |
| 5,162,977 | 11/1992 | Pauras et al. | 361/401 |

FOREIGN PATENT DOCUMENTS

| | | |
|---|---|---|
| 54140 | 6/1982 | European Pat. Off. |
| 172516 | 2/1986 | European Pat. Off. |
| 56-120729 | 9/1981 | Japan |
| 58-027719 | 2/1983 | Japan |
| 62-148511 | 7/1987 | Japan |
| 62-148512 | 7/1987 | Japan |
| 62-235335 | 10/1987 | Japan |

*Primary Examiner*—Mary Lynn Theisen

[57] ABSTRACT

Broadly, the present invention comprises a solventless process wherein blends of thermoset polyphenylene oxide and triallylcyanurates can be processed into fiber reinforced laminates, and especially laminates prepared by the Wiggins Teape process. One aspect of the present inventive process comprises blending the polyphenylene powder with a liquid epoxy material, optionally with flame retardants and catalysts, preferably in a high shear mixer at elevated temperature, e.g. in the range of about 100°–130° C. The resultant upstaged or partially-cured blend is sufficiently solidified to be granulated into a powder for Wiggins Teape processing or, optionally, conventional press processing into a fiber reinforced laminates. Resin systems thus-prepared exhibit both improved solderability resistance and improved resistance to organic solvents when compared to thermoplastic systems.

19 Claims, 2 Drawing Sheets

METHOD OF PREPARING MODIFIED POLYPHENYLENE OXIDE RESIN SYSTEMS FOR ELECTRICAL LAMINATES HAVING IMPROVED SOLDERABILITY AND SOLVENT RESISTANCE

BACKGROUND OF THE INVENTION

The present invention relates to a process for making thermoset polymer resin laminates and to products characterized by excellent solderability and solvent resistance which are prepared using such process. More particularly, the present invention relates to thermoset compositions comprising blends of polyphenylene ethers and certain multifunctional acrylics, e.g., triallylcyanurate, diallyl maleate, and methacryloyl chloride, which offer processing, cost, and/or performance advantages over the existing polyphenylene oxide/epoxy state-of-the-art, particularly in consumer electronic laminate applications.

Metal-clad boards, particularly such boards for use in fabricating printed circuits, are well-known in the art. The simplest of such boards generally comprises a resinous plastic (polymeric) substrate to which is bonded at least one thin sheet of an electrically conductive material, preferably copper. The resinous plastic substrate can be clad with the metal foil on one or both sides, depending upon the desired use, and can be rigid or flexible depending upon the composition of the resinous plastic substrate, the choice of reinforcement (if any), and the intended use of the board.

A number of polyphenylene ether compositions having favorable dielectric properties and utility in circuit board manufacture are known. However, due to deficiencies in one or more properties, many such compositions have not attained wide commercial use. In specific, while polyphenylene ethers are excellent dielectrics, deficiencies often are found in areas such as solvent resistance, flammability, solderability, and resistance to high temperatures. Moreover, times required for curing such compositions typically are too long for effective manufacture of circuit boards in large volume. Polyphenylene ethers are often combined with polyepoxides in an attempt to improve upon the aforementioned properties, but such combinations have not been found to be wholly satisfactory either.

In addition to excellent dielectric properties, resinous compositions to be used for printed circuit board manufacture should be highly flame-retardant. A V-1 rating, as determined by Underwriters Laboratories test procedure UL-94, is universally required, with V-0 usually being necessary. The V-0 rating requires a flame-out time (FOT) of not more than 10 seconds in any trial and a cumulative FOT of not more than 50 seconds for five samples. As a practical matter, a maximum cumulative FOT of 35 seconds often is mandated by purchasers.

The fabricated board should not lose substantial weight and its surface should not be appreciably marred by contact with methylene chloride, a solvent commonly used for cleaning. Since conductive connections with the printed circuit typically are made by soldering, the board must be solder-resistant as evidenced by the lowest possible percent increase in thickness (Z-axis expansion) when exposed to liquid solder at 288° C. In addition to all these properties of the cured material, a relatively short curing time is highly desirable.

In preparing rigid metal-clad boards, it is common to form individual lamina, commonly called prepregs, by formulating a resinous binder composition made from epoxy, modified styrene, or the like. A solvent solution of the resin is placed in an apparatus known as a "dip tank." Continuous webs of reinforcement can be preimpregnated in the tank and then dried in a vertical or horizontal treating tower or oven. Normally, the resin is partially cured or B-staged after exiting the treater tower or oven. The copper foil, optionally coated with an adhesive, is placed on one side of the prepreg and subjected to heating under pressure to effect a bond between the metal foil and the substrate. Multiple prepregs can be used in forming a single composite board. Additionally, multilayer printed wiring boards will have a number of interposed laminae and copper sheets.

Pressing of the boards can be effected in a press by placing the foil/substrate structure between the platens and closing the press, or a continuous belt can be used. The curing cycle in the press will depend upon the nature and thickness of the laminate, the time and temperature of the cycle being those required to cure the substrate, and the bonding adhesive layer, if present. Sufficient pressure is required to effect adequate flow of the adhesive and/or substrate resins in order to wet-out and bond adequately. The pressure must be sufficient to prevent blistering which is due to the release of gases resulting either from retained volatiles in the substrate or adhesive layers, or resulting from by-products of the curing process.

U.S. Pat. No. 3,716,449 discloses a process utilized in papermaking known as the Wiggins Teape process. This same basic process has been found to be useful in the preparation of reinforced polymeric composites. In the Wiggins Teape process, the polymeric blend is dispersed in an aerated surfactant foam, which is then deposited on a foraminous layer and collapsed to form a web. The web then is heat consolidated under conditions appropriate for the particular resin system and adhesive (if any).

BROAD STATEMENT OF THE INVENTION

Broadly, the present invention comprises a solventless process wherein blends of thermoset polyphenylene oxide and epoxy can be processed into fiber reinforced laminates, and especially laminates prepared by the Wiggins Teape process. One aspect of the present inventive process comprises blending the polyphenylene powder with a liquid epoxy material, optionally with flame retardants and catalysts, preferably in a high shear mixer at elevated temperature, e.g. in the range of about 100°–130° C. The resultant up-staged or partially-cured blend is sufficiently solidified to be granulated into a powder for Wiggins Teape processing or, optionally, conventional press processing into a fiber reinforced laminate. Resin systems thus-prepared exhibit both improved solderability resistance and improved resistance to organic solvents when compared to thermoplastic systems.

Another aspect of the present invention is directed to improved curable compositions made in accordance with the elevated temperature blending process disclosed herein. Such improved curable composition comprises:

(a) at least one polyphenylene ether having a number average molecular weight of at least about 12,000;

(b) an epoxy material comprising at least one polyglycidyl ether of a bisphenolic compound, said polyglycidyl ether having an average of at most one aliphatic hydroxy group per molecule;

(c) an effective amount of a flame retardant additive comprising a blend of:
  (1) the upstaged reaction product of:
    (i) tetrabromobisphenol A, and
    (ii) an epoxy material comprising at least one polyglycidyl ether of a bisphenolic compound, said polyglycidyl ether having an average of at most one aliphatic hydroxy group per molecule, and
  (2) poly(dibromophenylene)ether; and
(d) an effective amount of a curing catalyst.

Also disclosed are the use of 2-heptadecylimidazole as a latent catalyst in place of unmodified imidazoles, and a preferred catalyst package comprising a dicyanadiamide, benzyldimethylamine, and 2-methylimidazole. This preferred catalyst package not only offers faster cure kinetics at temperatures of greater than 220° C., which is desirable for continuous press operation, but also is less expensive than 2-heptadecylimidazole and other modified imidazole catalysts.

The inventive thermoset resin systems can be processed using Wiggins Teape methodology and exhibit both improved solderability resistance and improved resistance to organic solvents when compared to thermoplastic systems. Optionally, inorganic minerals such as talc or silica may be added to improve flexural stiffness and electrical properties.

DETAILED DESCRIPTION OF THE INVENTION

Figure 1:
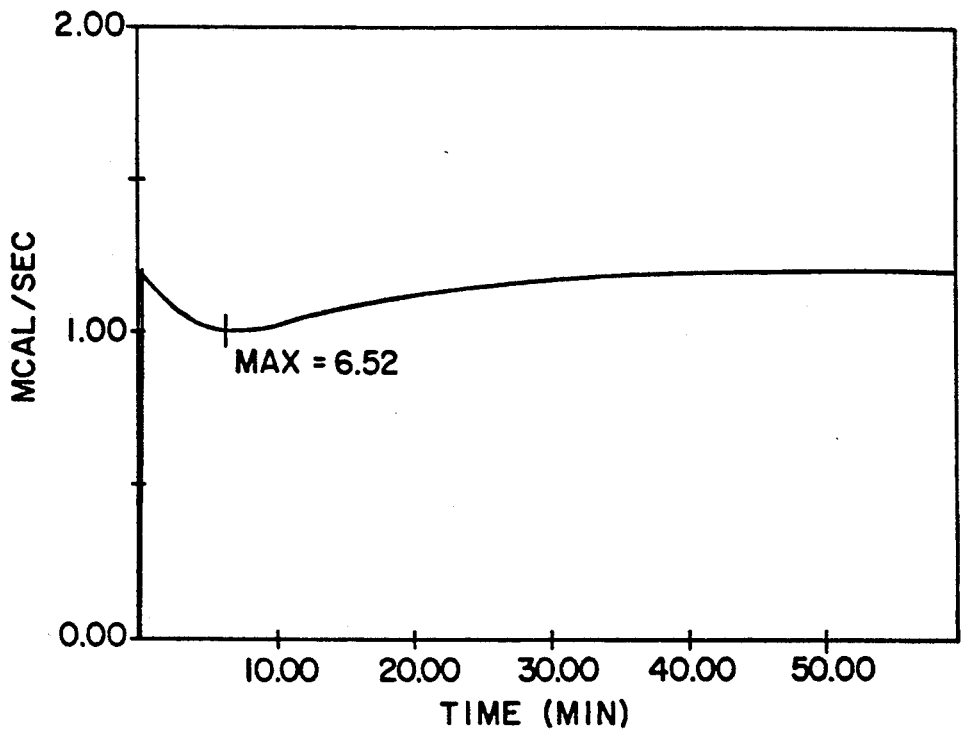
FIGS. 1-4 portray differential scanning calorimetry measurements of samples A-141 and A-142 of Example 4 by graphing time (min.) versus mcal/sec. These drawings will be described in greater detail in Example 4.

When the solid PPO and liquid epoxy are mixed at slightly elevated temperature under conditions of mixing, especially under high shear conditions of mixing, partial cure (i.e. up-staging) of the blend takes place. The resulting up-staged PPO/epoxy blend is in a solidified form that enables it to be subjected to size attrition, such as granulating or powdering by a variety conventional techniques, including, for example, hammer milling, pulverization, and ball milling (processes commercially available from Wedco, Bloomsbury, N.J.). Once the up-staged blend has been provided in powder form, it can be used to form reinforced laminates by a variety of techniques, the preferred of which is the Wiggins Teape process, as will be described in detail below.

The polyphenylene ethers (also known as polyphenylene oxides) used in the present invention are a well-known class of polymers. They are widely used in industry, especially as engineering plastics in applications requiring toughness and heat resistance.

The polyphenylene ethers comprise a plurality of structural units having the formula:

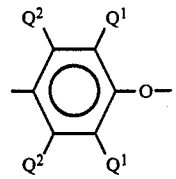

In each of said units independently, each $Q^1$ is independently halogen, primary or secondary lower alkyl (i.e., alkyl containing up to 7 carbon atoms), phenyl, haloalkyl, aminoalkyl, hydrocarbonoxy, or halohydrocarbonoxy wherein at least two carbon atoms separate the halogen and oxygen atoms; and each $Q^2$ is independently hydrogen, halogen, primary or secondary lower alkyl, phenyl, haloalkyl, hydrocarbonoxy or halohydrocarbonoxy as defined for $Q^1$. Examples of suitable primary lower alkyl groups are methyl, ethyl, n-propyl, n-butyl, isobutyl, n-amyl, isoamyl, 2-methylbutyl, n-hexyl, 2,3-dimethylbutyl, 2-,3- or 4-methylpentyl and the corresponding heptyl groups. Examples of secondary lower alkyl groups are isopropyl, sec-butyl and 3-pentyl. Preferably, any alkyl radicals are straight chain rather than branched. Most often, each $Q^1$ is alkyl or phenyl, especially $C_{1-4}$ alkyl, and each $Q^2$ is hydrogen.

Both homopolymer and copolymer polyphenylene ethers are within the purview of the process of the present invention. Suitable homopolymers are those containing, for example, 2,6-dimethyl-1,4-phenylene ether units. Suitable copolymers include random copolymers containing such units in combination with, for example, 2,3,6-trimethyl-1,4-phenylene ether units. Many suitable random copolymers, as well as homopolymers, are disclosed in the patent literature. Reference is made to U.S. Pat. Nos. 4,054,553, 4,092,294, 4,477,649, 4,477,651 and 4,517,341, the disclosures of which are incorporated by reference herein.

The epoxy material used in conjunction with the present invention may be either an epoxy compound or a mixture of epoxy compounds, of which an essential ingredient is at least one polyglycidyl ether of a bisphenolic compound. A particular class of useful epoxy components optionally can be brominated to provide flame retardancy to the inventive laminate. The most common compounds of this type are prepared by the reaction of bisphenols with epichlorohydrin. (By "bisphenol" as used herein is meant a compound containing two hydroxyphenyl groups attached to an aliphatic or cycloaliphatic moiety, which may also contain aromatic substituents.) Said compounds may be represented by the formula:

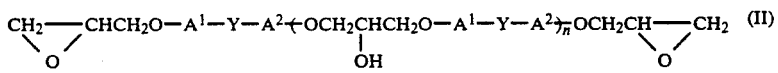

wherein n has an average value up to 1, each of $A^1$ and $A^2$ is a monocyclic divalent aromatic radical and Y is a bridging radical in which one or two atoms separate $A^1$ from $A^2$. The O-$A^1$ and $A^2$-O bonds in formula II are usually in the meta or para positions of $A^1$ and $A^2$ in relation to Y. In this formula, the $A^1$ and $A^2$ values may be unsubstituted phenylene or substituted derivatives thereof, illustrative substituents (one or more) being alkyl, nitro, alkoxy, and the like. Unsubstituted phenylene radicals are preferred. Each of $A^1$ and $A^2$ may, for example, be o- or m-phenylene and the other p-phenylene, but both preferably are p-phenylene.

The bridging radical, Y, is one in which one or two atoms, preferably one, separate $A^1$ from $A^2$. It is most often a hydrocarbon radical and particularly a saturated radical such as methylene, cyclohexylmethylene, ethylene, isopropylidene, neopentylidene, cyclohexylidene, or cyclopentadecylidene, especially a gem-alkylene (alkylidene) radical and most preferably isopropylidene. Also included, however, are radicals which contain atoms other than carbon and hydrogen, e.g., carbonyl, oxy, thio, sulfoxy, and sulfone.

The present invention contemplates the use of ethers containing an average of at most one aliphatic hydroxy group per molecule; i.e., the average value of n is up to 1. Commercially available materials of this type, derived from 2,2-bis(4-hydroxyphenyl)propane (bisphenol A), include Epon 825 (n=0) and Epon 828 (n=about 0.14), available from Shell Chemical Company.

Another epoxy component is at least one bisphenol containing bromine in the form of substituents of the aromatic rings, usually a brominated derivative of bisphenol A. Its principal purpose according to the invention is to provide flame retardancy. 2,2-bis(3,5-dibromo-4-hydroxyphenyl)propane is preferred as this reagent because of its availability, relatively low cost, and particular suitability for the purposes of the invention. Mixtures of such ethers, part of the components of said mixture being halogen-free and the balance thereof containing bromine as aryl substituents, also can be used. The total amount of bromine therein is about 10%–60% by weight.

As mentioned, supra, compounds of this type are prepared conventionally by the reaction of bisphenols with epichlorohydrin. When brominated, these compounds may be represented by the formula:

for compounding and Wiggins Teape mat drying; and (3) faster cure kinetics at temperatures greater than 220° C., desirable for continuous press operation.

The use of inorganic minerals, e.g., talc or silica, together with the upstaged tetrabromobisphenol A/epoxy flame retardant additive and the polyphenylene oxide, has been found to improve impact and flexural toughness, in addition to providing excellent thermal stability and other properties desirable for circuit board substrates.

The Wiggins Teape process is commonly utilized in the manufacture of chopped fiber-reinforced composites, wherein a polyphenylene/epoxy blend and greater than 50 weight-percent chopped fiber are dispersed in an aerated surfactant foam. The foam is deposited on a foraminous layer and collapsed to form a web. The web is consolidated at a temperature of greater than about 280° C. and a pressure of greater than about 500 psi. The high temperature, high pressure consolidation of such composites is well-known in the art and need not be detailed here. The resulting composite typically has a flexural modulus of greater than 2,000 ksi and flexural strength values of greater than about 30,000 psi and typically between about 30,000 and 50,000 psi.

With respect to the chopped fiber, the length of such fiber generally ranges from between about ⅛ and ¾ inches in length. Conventional reinforcing fibers include, for example, E glass, S glass, quartz fiber, inorganic fiber (e.g., Nextel brand), organic fiber (e.g., Kevlar or Nomex brands), and aluminum oxide or other ceramic fibers. Further on conventional fibers can be found in *Handbook of Fillers and Reinforcements for Plastics*, edited by Katz and Milewski, Van Rostrand Reinhold Company, Litton Educational Publishing, Inc. (1978).

The compositions of this invention also may contain

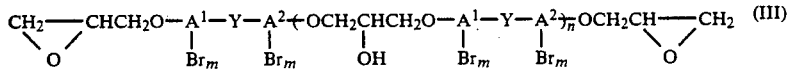

wherein m is 0–4 and all other symbols are as defined with respect to formula II.

An important component of the flame-retardant composition made in accordance with present invention is an effective amount of a flame retardant additive comprising the upstaged reaction product of such an epoxy material and tetrabromobisphenol A. Unexpectedly, it has been discovered that the combination of poly(dibromophenylene) ether and the upstaged tetrabromobisphenol A/epoxy flame retardant additive results in better Z-axis stability following a 10-second solder dip at 550° F. than analogous formulations using these flame retardants separately.

Catalysts effective as curing agents for epoxy resins, such as imidazoles, may be utilized in the practice of the invention. Particularly useful imidazoles are imidazole, 1-methylimidazole, 1,2-dimethylimidazole, 2-methylimidazole, 2-heptadecylimidazole, 2-ethyl-4-methylimidazole, 2-undecylimidazole, and 1-(2-cyanoethyl)-2-phenylimidazole. Preferred imidazoles are 1,2-dimethylimidazole and 2-heptadecylimidazole. However, particularly preferred in the practice of the present invention is a catalyst package which comprises a dicyanadiamide, benzyldimethylamine, and 2-methylimidazole. This preferred catalyst package meets three major criteria: (1) a reduced cost vis-a-vis the more expensive modified imidazole catalysts; (2) latent activity at less than 130° C., the temperature required such conventional materials as flame retardants (e.g., hydrated alumina, decabromodiphenyl ether), fillers and reinforcing media (e.g., glass fiber, polyester fiber, polypropylene fiber, cellulosics, nylon, acrylics), antioxidants, thermal and ultraviolet stabilizers, lubricants, anti-static agents, dyes, pigments and the like, all in conventional proportions.

The following examples show in detail how the present invention can be practiced but should in no way be construed as limiting. In this application, all percentages and proportions are by weight and all units are in the metric system, unless otherwise expressly indicated.

IN THE EXAMPLES

For convenience several abbreviations are used in the examples. A list of these abbreviations and the terms for which they stand are given below:

FR=flame-resistant
PPO=polyphenylene oxide
RT=room temperature
UL=Underwriters Laboratories.

Following is a list of the ingredients used in the examples, together with the manufacturers thereof.

PPO 640 polyphenylene oxide (General Electric Plastics, Selkirk, N.Y.)

Epon 828 epoxy resin (Shell Chemical, Houston, Tex.)

Epon 1001 epoxy resin (Shell Chemical, Houston, Tex.)
DER 542 brominated epoxy resin (Dow Chemical, Freeport, Tex.)
PO64P poly(dibromophenylene)ether (Great Lakes Chemical, West Lafayette, Ind.)
Thermogard FR sodium antimonate (M & T Chemical, Rahway, N.J.)
Zinc stearate (Morton Thiokol Chemicals, Chicago, Ill.)
Zinc phosphate (Mineral Pigments Corp., Beltsville, Md.)
Ethacure 100 diethyltoluene diamine (Ethyl Corp., Baton Rouge, La.)
1,2 dimethylimidazole (Aldrich Chemical Co., Milwaukee, Wis.)
Curezol C17Z 2-heptadecylimidazole (Pacific Anchor Chemical Corp., Los Angeles, Calif.)
Zinc octoate (Ferro Corp., Bedford, Ohio)
Antimony trioxide (Amspec Chemical Corp., Gloucester City, N.J.)
Benzyldimethylamine (BDMA) (Hexcel Specialty Chemicals, Zeeland, Mich.)
2-Methylimidazole (2 MI) (Pacific Anchor Chemical Corp., Los Angeles, Calif.)
Dicyanadiamide (DICY) (Pacific Anchor Chemical Corp., Los Angeles, Calif.)
Talc (Pfizer & Pfizer, Dillion, Mont.)
Silica (Degussa Corp., Ridgefield Park, N.J.).

EXAMPLE 1

The following formulation was prepared both by mixing the ingredients in a food blender at room temperature and by blending in a Brabender torque rheometer, equipped with roller mixing blades, at temperatures between 120°–130° C. and at a mixing speed of 50 rpm:

TABLE 1

| Ingredient | Amount (wt %) |
| --- | --- |
| PPO 640 polyphenylene oxide | 57.0 |
| Epon 828 epoxy | 20.0 |
| DER 542 brominated epoxy | 7.2 |
| PO64P poly(dibromophenylene)ether | 8.3 |
| Thermogard FR sodium antimonate | 3.0 |
| Zinc stearate | 1.5 |
| Zinc phosphate | 1.5 |
| Ethacure 100 | 1.0 |
| 1,2 dimethylimidazole | 0.5 |

The room temperature blends were pasty and could not be dispersed in an aqueous foam. The Brabender blends became plasticized after mixing, and could be granulated through a 1 mm screen on a Wiley granulator. Both blends were combined with six 4"×6" plies of 7642 glass cloth (Burlington Industries) by evenly distributing approximately 4 grams of resin powder in between each ply of glass cloth.

These layups were then pressed between aluminum foil coated with Teflon polytetrafluoroethylene (E. I. du Pont de Nemours and Co., Wilmington, Del.) in a press at 250° C., 800 psi (laminate pressure), for 30 minutes, then cooled under pressure.

TABLE 2

| V-0 PPO/Epoxy Formulation Test Results: Room Temerpature Mixing vs. Elevated Temperature High Shear Blending | | |
| --- | --- | --- |
| Test | RT Mix | 130° C. Blend |
| Solderability at 550° F.* | 38% | 4% |
| Solvent resistance** | Poor | Fair |

TABLE 2-continued

| V-0 PPO/Epoxy Formulation Test Results: Room Temerpature Mixing vs. Elevated Temperature High Shear Blending | | |
| --- | --- | --- |
| Test | RT Mix | 130° C. Blend |
| After 45 minutes at 210° C. annealing: | | |
| Laminate appearance | Blistering | No Blistering |
| Solderability at 550° F.* | 3% | 0% |
| Solvent resistance** | Fair | Good |

*Measured as % Z-axis expansion following 10-second dip in a solder bath at the specified temperature
**After 10-minute soak in methylene chloride:
poor = severe attack
fair = slight attack
good = no attack The test results in Table 2 indicate that the "preblended" sample showed reduced Z-axis expansion in the solder dip test and better blister resistance upon high temperature annealing. In addition, improved methylene chloride resistance was observed before and after annealing.

EXAMPLE 2

The following formulation was prepared in the same manner as described for Example 1:

TABLE 3

| Ingredient | Amount (wt %) |
| --- | --- |
| PPO 64 polyphenylene oxide | 55.0 |
| Epon 828 epoxy | 20.0 |
| DER 542 brominated epoxy | 18.0 |
| Thermogard FR sodium antimonate | 3.0 |
| Zinc stearate | 1.5 |
| Zinc phosphate | 1.5 |
| Ethacure 100 | 0.5 |
| 1,2 dimethylimidazole | 0.5 |

Prior to the Brabender blending, the consistency of this blend was pasty and could not be granulated into a solid powder.

The Wiggins Teape mat was prepared by dispersing 55 g of powder with 45 g of G filament ½" chopped glass fibers (PPG Industries, Pittsburgh, Pa.) in a 0.15% Triton X100 aqueous solution. A mat was cast in a 12"×12" sheet former by vacuum filtering through a 160 mesh screen. This mat was oven-dried at 100° C. for 45 minutes, then pressed at 250° C., 800 psi, for 10 minutes between two Teflon-lined aluminum foil sheets. The results recorded are set forth below:

TABLE 4

| V-0 PPO/Epoxy Formulation Test Results: Room Temperature Mixing vs. Elevated Temperature High Shear Blending | | |
| --- | --- | --- |
| Test | 125° C. Blend | PD 1052* |
| Solderability at 550° F.** | 16% | >30% |
| Solvent resistance*** | poor-fair | poor |
| Flex strength (psi) | 43,200 | 35,000 |
| Flex modulus (MMpsi) | 1.73 | 1.3 |
| Dielectric constant | | |
| As received | 3.30 | 3.08 |
| 24 hrs. H2O immersion | 3.91 | 3.18 |
| Dissipation factor | | |
| As received | 0.012 | 0.006 |
| 24 hrs. H2O immersion | 0.016 | 0.088 |
| UL 94 flammability | V-0 | V-1 |
| After 45 minutes at 210° C. annealing: | | |
| Laminate appearance | minor blistering | severe blistering |
| Solderability at 550° F. | >2% | 25% |

TABLE 4-continued
V-0 PPO/Epoxy Formulation Test Results:
Room Temperature Mixing vs.
Elevated Temperature High Shear Blending

| Test | 125° C. Blend | PD 1052* |
|---|---|---|
| Solvent resistance | fair | poor |

*Thermoplastic FR PPO Wiggins Teape material (General Electric Plastics, Bergen-op-Zoom, The Netherlands)
**Measured as % Z-axis expansion following 10-second dip in a solder bath at the specified temperature
***After 10-minute soak in methylene chloride:
poor = severe attack
fair = slight attack
good = no attack Preliminary test results, reported in Table 4, show improved solderability, solvent resistance, flexural properties, and better retention of dielectric properties following 24-hour water immersion at room temperature vis-a-vis thermoplastic FR PPO Wiggins Teape material.

EXAMPLE 3

The formulations listed in Table 5 were prepared by blending ingredients in a Brabender torque rheometer, equipped with roller mixing blades, at temperatures between 100°–120° C. and at a mixing speed of 50 rpm for 3 minutes. The plasticized mixtures were then cryogenically cooled and granulated in a Wiley mill through a 1 mm screen.

Sixty grams of this granulated resin was combined with 50 g of experimental glass fiber (Product 8-24203, ⅛" chopped, M filament, PPG Industries, Pittsburgh, Pa.) and agitated in 5 liters of a 0.14% Triton X100 (Rhom and Haas Corp.) aqueous solution for 2 minutes. This solution then was poured into a 12"×12" sheet former and vacuum-filtered through a 160 mesh screen to form a resin-impregnated glass mat. Mats were subsequently sprayed with 10% Epon 1001 epoxy (Shell Chemical Co.) in acetone and dried in a convection oven at 100° C. for 45 minutes.

Laminates (12"×6") were prepared by pressing two layers of the mat between two stainless steel pans treated with release coating in a heated press at 230° C., 600 psi for 10 minutes. These laminates were tested for solder resistance by dipping ½"×5" test specimens in a solder bath at 550° F. and measuring percent change in the Z-axis. In addition, flammability, flexural strength, and modulus were measured and reported in Table 5.

TABLE 5
FR PPO/Epoxy Formulations:
Comparison of Solder Resistance,
Flammability and Flexural Properties

| | 1 | 2 | 3 |
|---|---|---|---|
| Formulation | | | |
| PPO 640 | 43.0 | 43.0 | 43.0 |
| PO64P | — | 14.0 | 7.0 |
| S6819 upstage* | 50.0 | — | 26.0 |
| Epon 828 | — | 36.0 | 17.0 |
| Sodium antimonate | 3.0 | 3.0 | 3.0 |
| Curezol C17Z | 2.0 | 2.0 | 2.0 |
| Zinc stearate | 2.0 | 2.0 | 2.0 |
| Test | | | |
| Solderability** | 1% | 2% | 3% |
| Flammability (UL 94) | V-0 | V-0 | V-0 |
| Flexural strength (M psi) | 25.0 | 27.3 | 27.4 |

TABLE 5-continued
FR PPO/Epoxy Formulations:
Comparison of Solder Resistance,
Flammability and Flexural Properties

| | 1 | 2 | 3 |
|---|---|---|---|
| Flexural modulus (MM psi) | 1.53 | 1.37 | 1.32 |

*S6819 epoxy is the reaction product of Epon 828 diglycidyl ether of bisphenol A (epoxide equivalent weight 185-195, Shell Chemical Co.) and tetrabromobisphenol A (3.5:1.0 molar ratio), reaction initiated at 120° C. using diphenylphosphine catalyst, toluene solvent, supplied at 75% solids.
**Masured as % Z-axis expansion following a 10-second dip in a solder bath at 550° F.

The above-tabulated test results indicate that formulation #3, in which PO64P and TBBPA upstaged material were combined, resulted in the best solder resistance, while not adversely affecting flammability or flexural properties.

EXAMPLE 4

The formulations in Table 6 were prepared in the same manner as described in Example 3. These formulations containing modified imidazoles (e.g., Curezol C17Z 2-heptadecylimidazole or other Curezol products offered by Pacific Anchor, as in formulation A142) are compared with formulations containing low molecular weight imidazoles (e.g., 1,2 dimethylimidazole, as in formulation A141).

TABLE 6
FR PPO/Epoxy Formulations:
Comparison of Modified Imidazoles vs. Unmodified Imidazoles

| Formulation | A141 | A142 |
|---|---|---|
| PPO 640 | 42.5 | 42.0 |
| PO64P | 5.0 | 5.0 |
| S6819 upstage | 35.0 | 35.0 |
| Epon 828 | 10.0 | 10.0 |
| Sodium antimonate | 3.0 | 3.0 |
| Cerzol C17Z | — | 2.0 |
| Zinc octoate | 3.0 | 3.0 |
| Ethacure 100* | 0.75 | — |
| 1,2 Dimethylimidazole | 0.75 | — |
| Processing: 230, 1000 psi, 10 min | | |
| Laminate appearance | poor | good |
| DSC data** | | |
| % Cure after 1 hr at 90° C. | 75% | <1% |
| % Cure at 230° C. isotherm | 25% | >99% |

*Added as a latent low activity catalyst and hardener.
**See attached scans. Data obtained from Perkin-Elmer DSC II.

Figure 2:
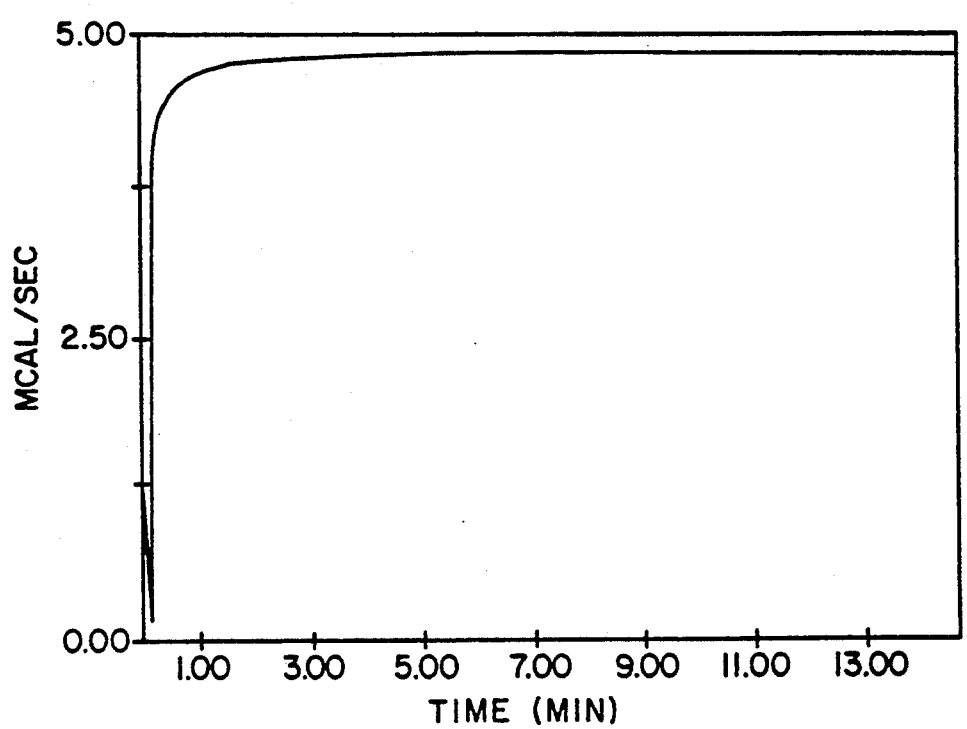
Figure 3:
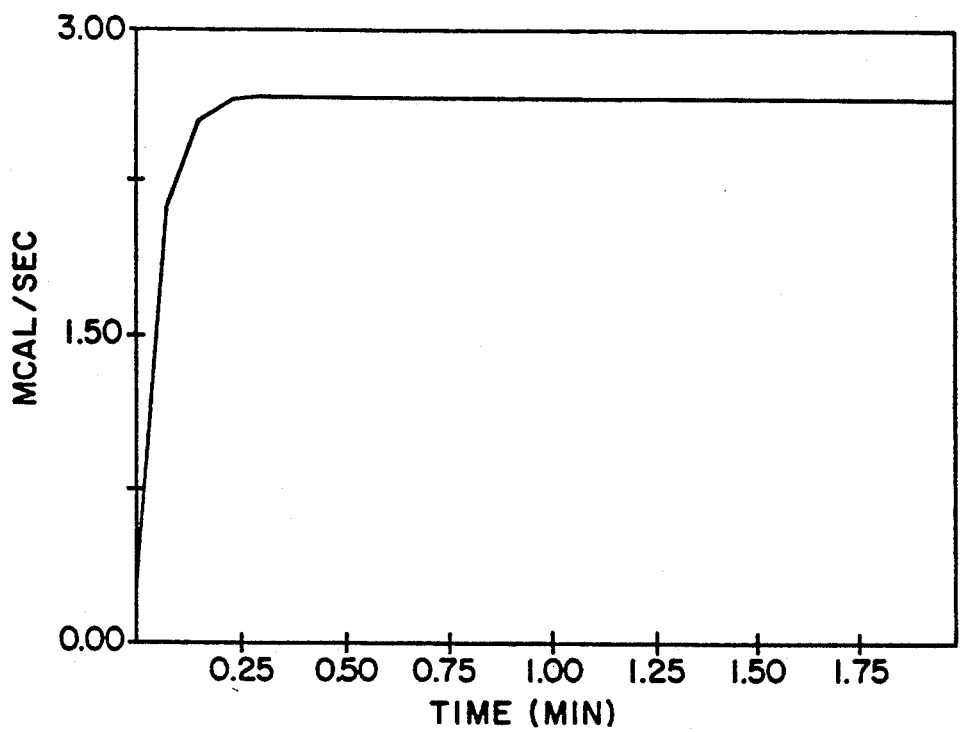
Figure 4:
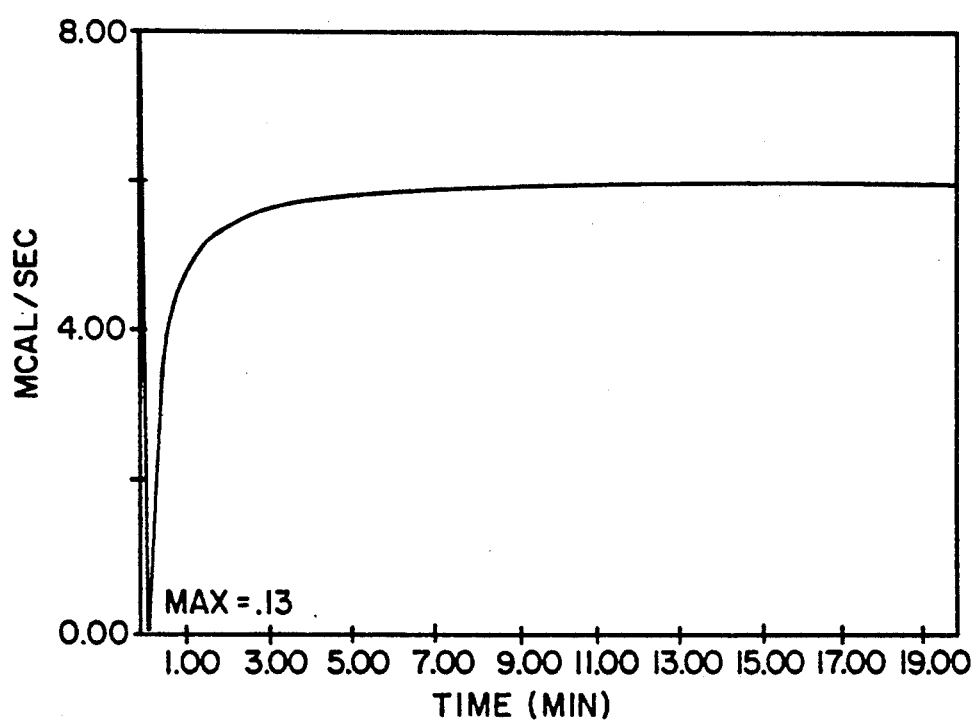

Following the mat drying step and lamination step, it became apparent that formulation A141 did not consolidate into a uniform board, whereas formulation A142 did result in the desired consolidation. Differential scanning calorimetry (DSC) measurements verified that 75% of the crosslinking reaction in A141 had occurred in the drying oven, whereas <1% had occurred in the same step for A142, as can be seen from FIGS. 1–4. Samples A141 are depicted at FIGS. 1 and 2: FIG. 1, 90° C.-1 hr., sample weight 10.70 mg, scan rate of 320° C./min., peak from 0.44 to 59.5, onset at −0.11, and cal/g of −19.55; and FIG. 2, 230° C./isothermally after 90° C. for 1 hr, sample weight of 10.7 mg, scan rate of 320° C./min., peak from 0.02 to 14.75, cal/gm of −7.3. Samples A-142 are depicted at FIGS. 3 and 4: FIG. 3, 90° C.-45 min., sample weight of 10.40 mg, scan rate of 320° C./min., peak from 0 to 1.96, cal/gam of −0.29; FIG. 4, 230° C. isothermally after 90° C. for >45 min., sample weight of 10.40 mg, scan rate of 320° C./min.: peak from 0 to 3, onset of 0.04, cal/g of −24.73, max/min of .139017; peak from 3 to 5, onset at 0, cal/g of −3.26, max/min of 0; peak from 5 to 10, onset at 0, cal/g of −3.46, max/min of 0; peak from 10 to 19.9, onset at 0, cal/g of −1.5, max/min of 0; and peak from 0 to 19.9, onset at 0.04, cal/g of −32.92.

The improved latency for modified imidazoles most likely results from their higher melt points, i.e., the catalyst is not active until the processing temperature exceeds the melt point of the catalyst. Examples of other modified imidazole catalysts having melt points in excess of 90° C. include Curezol 2PZ (2-phenylimidazole), 2PZ-CNS (1-cyanoethyl-2-phenylimidazole-trimellitate), 2MZ-AZINE (2,4-diamino-6-(2'-methylimidazolyl-1'))ethyl-s-triazine), 2PHZ (2-phenyl-4,5-dihydroxymethylimidazole), 2PZ-OK (2-phenylimidazole isocyanuric acid addition compound (all commercially available from Pacific Anchor Chemical Corp.). Preliminary tests on the reactivity of these catalysts in high temperature Brabender testing indicate that Curezol 2PZ-CNS and 2MZ-AZINE are about as reactive as C17Z. Other modified imidazoles, Ajicure PN-23 and MY-24 (proprietary formulations for use in latent epoxy resin systems) are available from Ajinimoto Co., Tokyo, Japan.

EXAMPLE 5

The formulations listed in Table 7 were prepared by first powder blending the ingredients in a blender. The blended powder was then compounded in a Brabender torque rheometer, equipped with roller mixing blades, at temperatures between 100°–120° C. and at a mixing speed of 50 rpm for 5 minutes. Powdered additives and other water-soluble additives were homogeneously dispersed and encapsulated in upstaged epoxy during the compounding step. The compounded mixtures were then cooled to 45° F. and granulated in a Wiley mill through a 1 mm screen. High molecular weight upstaged epoxy improved the handling of the resin mix as the granulated mixture resulted in a free flowing powder (a requirement for the Wiggins Teape process).

Seventy-five grams of this granulated resin was combined with 50 g of experimental glass fiber (Product 8-24203, ¼" chopped, M filament, PPG Industries) and agitated in 5 liters of 0.14% Triton X100 (Rohm and Hass Corp.) aqueous solution for 2 minutes. This solution was then poured into a 12"×12" sheet former and vacuum-filtered through a 160 mesh screen to form a resin-impregnated glass mat. Mats were subsequently dried in a convection oven at 100° C. for 45 minutes.

TABLE 7

FR Filled Epoxy Formulations:
Comparison of Solder Resistance,
Flammability, Electrical and Flexural Properties

|  | 1 | 2 | 3 |
|---|---|---|---|
| Formulation | | | |
| PPO 640 | 6.0 | 26.0 | 42.0 |
| PO64P | — | — | 4.7 |
| S6819 upstage | 57.0 | 51.5 | 33.3 |
| Epon 828 | 6.0 | 6.0 | 7.6 |
| Antimony trioxide | 1.0 | 1.9 | 2.8 |
| Zinc stearate | 2.0 | 2.9 | 1.8 |
| Curezol C17Z | — | — | 0.8 |
| DICY | 2.25 | 2.3 | 2.2 |
| 2MI | 0.2 | 0.3 | — |
| BDMA | 0.3 | — | 0.3 |
| Talc | 25.25 | 5.0 | — |
| Silica | — | 5.0 | 5.0 |
| Tests | | | |
| Solder loft** | 0% | 0% | 3.6% |
| Solder loft** (after annealing) | 0% | 0% | 0% |
| Flammability (UL 94) | V-0 | V-0 | V-0 |

TABLE 7-continued

FR Filled Epoxy Formulations:
Comparison of Solder Resistance,
Flammability, Electrical and Flexural Properties

|  | 1 | 2 | 3 |
|---|---|---|---|
| Flexural strength (M psi) | 20.0 | 37.0 | 37.0 |
| Flexural modulus (MM psi) | 1.2 | 1.7 | 1.5 |
| Notched IZOD (ft lbs/in) | 5.8 | 6.0 | 7.0 |
| Solvent resistance (10 min, methylene chloride) | G | F-G | F |
| CTI (volts) | 400 | 200 | 150 |
| Dielectric constant (1 MHz) | | | |
| Initial | 4.2 | 4.0 | 3.7 |
| D-24/23 | 4.3 | 4.1 | 3.8 |
| Water absorption % | 0.14 | 0.15 | 0.2 |
| Peel strength (in-lb/in) Initial | 3.0 | 7.4 | 9 |
| DSC data | | | |
| Heat of reaction (cal/g) | | | |
| Before drying | 28.3 | 30.1 | 26.7 |
| After drying (45 min, 100° C.) | 27.1 | 29.1 | 23.47 |
| T max (°C.)* | 160–170 | 160–170 | 150–160 |
| RDA analysis | | | |
| Minimum viscosity | | | |
| Before drying | 34 | 72 | 116 |
| After drying | 59 | 74 | 303 |

*Temperature at which resin showed maximum reactivity.
**Measured as % Z-axis expansion following a 10-second dip in a solder bath at 550° F.

DSC and RDA analysis indicated that the resin system was stable after 45 minutes of drying at 100° C. and also exhibited high reactivity between 220°–240° C. These measurements indicate that very little reaction occurred during the drying step, and that high flow (low minimum viscosity values) were maintained. This is desirable to maximize the resin/glass coupling reaction and to permit elimination of voids during the lamination process. Isothermal study (DSC) at greater than 220° C. showed that greater than 95% reaction was completed in less than 5 minutes, which is indicative of a faster curing system. RDA analyses also demonstrated the high reactivity of the system as the rate of rise in viscosity from minimum to maximum was very high.

Laminates (12"×12") were prepared by pressing two layers of the mat between two stainless steel pans treated with release coating in a heated press at 230° C., 1200 psi, for 5 minutes. The resulting laminates were void-free, and surface quality was suitable for electronic applications. These laminates were tested for solder resistance by dipping ½"×5" test specimens in a solder bath at 550° F. and measuring percent expansion in Z-axis direction. In addition, solvent resistance was tested by immersion of the test specimen in methylene chloride for 10 minutes and monitoring surface degradation. Flammability, electrical properties, flexural strength and modulus were also measured using standardized IPC test methods and are reported in Table 7, supra.

These test results indicated that Formulation #1, wherein talc and TBBPA upstaged epoxy were combined, resulted in high CTI values and the best solder and solvent resistance, while not affecting flammability. Filling epoxies with inexpensive minerals provides an opportunity for low cost applications in conjunction with the Wiggins Teape process. Use of talc significantly reduced the tackiness of epoxy, resulting in free-flowing powder upon pulverization. A free flowing characteristic is desired for the Wiggins Teape process. Talc also reduced the need for antimony trioxide as a flame retardant. However, the addition of minerals in epoxy resulted in low copper peel strength. Flexural strength also was reduced to 20,000 psi, as compared to 40,000 for a neat PPO/epoxy system.

Table 7 also indicates the effect of adding PPO in a filled epoxy system. Epoxies filled with minerals are very brittle and show poor impact and flexural properties. Epoxies filled with minerals are very brittle and show poor impact and flexural properties. PPO was used to toughen the system. The study indicated that the flexural properties improved significantly when 6-7% PPO level by weight was added to mineral filled epoxy system. A further increase in mechanical properties has been observed when the PPO level increased from 6% to 26% by weight. The dielectric constant, however, decreased from 4.1 to 3.7 when the amount of PPO increased from 6% to 42%. However, thermal stability, solvent resistance, and CTI value were reduced at high PPO levels. A 25-30% PPO level appeared to be optimum for most of the properties, as flexural properties were not increased by further addition of PPO.

Due to their low melt temperatures and tackiness, low molecular weight epoxies pose handling difficulties during the compounding and size reduction step. Preparation of a high molecular weight upstaged epoxy overcame the foregoing problems due to its high melt temperature and reduced tackiness, resulting in free-flowing powder when pulverized. This low cost brominated upstaged epoxy also provided flame retardancy. Total epoxy concentration should be greater than 50% in a mix for good thermal stability due to high crosslink density. The above system has been cured with DICY as curing agent and BDMA/2MI as catalyst.

We claim:

1. A method for making thermoset polyphenylene oxide/epoxy prepreg, which comprises the steps of:
    (a) blending a polyphenylene oxide (PPO) powder with a liquid epoxy material at elevated temperature to make a PPO/epoxy upstaged product;
    (b) granulating the resultant PPO/epoxy upstaged product into particulates;
    (c) combining said particulates with one or more of reinforcing cloth or reinforcing fiber; and
    (d) curing said combination of step (c) at elevated temperature and elevated pressure.

2. The method of claim 1 wherein said PPO powder is blended with said liquid epoxy material in step (a) under high shear mixing conditions.

3. The method of claim 2 wherein said PPO powder is blended with said liquid epoxy material in step (a) at a temperature of about 100°-130° C.

4. The method of claim 1 wherein said elevated temperature in step (d) ranges from between about 210° and 240° C. and said elevated pressure in step (d) ranges from between about 600 psi and 1000 psi.

5. The method of claim 1 wherein for reinforcing fiber, said process step (c) comprises:
    (c1) dispersing said particulates and fiber in an aerated surfactant foam;
    (c2) depositing said foam on a foraminous layer and collapsing said foam to form a web.

6. The method claim 5 wherein said fiber is one or more of a glass fiber, an organic fiber, or a ceramic fiber.

7. The method of claim 6 wherein said fiber is glass fiber.

8. The method of claim 7 wherein said fiber ranges in length between about 0.125 and 0.75 inches.

9. The method of claim 1 wherein for cloth, step (c) comprises the steps of:
    (c1) combining said particulates with at least one ply of cloth to form a curable laminate; and
    (c2) curing said curable laminate at elevated temperature and elevated pressure.

10. The method of claim 9 wherein particulates are distributed between two or more plies of cloth.

11. The method claim 10 wherein said cloth is one or more of glass cloth, organic cloth, or ceramic cloth.

12. The method of claim 11 wherein said cloth is glass cloth.

13. The method of claim 1 wherein blended in step (a) is a curable composition comprising:
    (a) at least on polyphenylene ether having a number average molecular weight of at least about 12,000;
    (b) an epoxy material comprising at least one polyglycidyl ether of a bisphenolic compound, said polyglycidyl ether having an average of at most one aliphatic hydroxy group per molecule;
    (c) an effective amount of a flame retardant additive comprising a blend of:
        (1) the upstaged reaction product of:
            (i) tetrabromobisphenol A, and
            (ii) an epoxy material comprising at least one polyglycidyl ether of a bisphenolic compound, said polyglycidyl ether having an average of at most one aliphatic hydroxy group per molecule, and
        (2) poly(dibromophenylene)ether; and
    (d) an effective amount of a curing catalyst.

14. The method of claim 13 wherein said polyphenylene ether is a poly(2,6-dimethyl-1,4-phenylene ether) having a number average molecular weight in the range of about 15,000–40,000.

15. The method of claim 14 wherein said epoxy material has the formula:

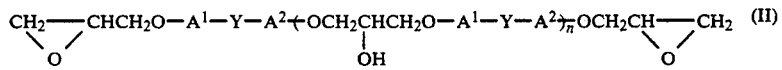

wherein each of $A^1$ and $A^2$ is a monocyclic divalent aromatic radical, Y is a bridging radical in which one or two atoms separate $A^1$ from $A^2$, and n has an average value up to 1.

16. The method of claim 15 wherein each of $A^1$ and $A^2$ is p-phenylene and Y is isopropylidene.

17. The method of claim 13 wherein said curing catalyst comprises:
    (a) dicyanadiamide;
    (b) benzyldimethylamine; and
    (c) 2-methylimidazole.

18. The method of claim 13 wherein said curing catalyst comprises a modified imidazole having a melt point greater than about 90° C.

19. The method of claim 18 wherein said modified imidazole is 2-heptadecylimidazole.

* * * * *